US006566924B2

(12) United States Patent
Lin et al.

(10) Patent No.: US 6,566,924 B2
(45) Date of Patent: May 20, 2003

(54) PARALLEL PUSH ALGORITHM DETECTING CONSTRAINTS TO MINIMIZE CLOCK SKEW

(75) Inventors: Shen Lin, Foster City, CA (US); Norman Chang, Fremont, CA (US); Keunmyung Lee, Palo Alto, CA (US); Osamu Nakagawa, Redwood City, CA (US); Weize Xie, Cupertino, CA (US)

(73) Assignee: Hewlett-Packard Development Company L.P., Houston, TX (US)

( * ) Notice: Subject to any disclaimer, the term of this patent is extended or adjusted under 35 U.S.C. 154(b) by 0 days.

(21) Appl. No.: 09/911,398

(22) Filed: Jul. 25, 2001

(65) Prior Publication Data

US 2003/0020527 A1 Jan. 30, 2003

(51) Int. Cl.[7] .................................. H03L 7/00
(52) U.S. Cl. ...................... 327/160; 327/161; 327/286
(58) Field of Search ................. 327/160, 161, 327/151, 153, 154, 261, 262, 265, 269, 270, 273, 279, 286, 395, 400, 18, 31–38, 2, 12

(56) References Cited

U.S. PATENT DOCUMENTS

| | | | | | |
|---|---|---|---|---|---|
| 4,755,704 A | * | 7/1988 | Flora et al. | ................. | 327/152 |
| 5,313,501 A | * | 5/1994 | Thacker | ....................... | 375/117 |
| 5,394,024 A | * | 2/1995 | Buckenmaier et al. | ...... | 327/160 |
| 5,506,878 A | * | 4/1996 | Chiang | ......................... | 377/39 |
| 5,742,798 A | * | 4/1998 | Goldrian | ..................... | 395/551 |
| 5,744,991 A | * | 4/1998 | Jeffereson et al. | .......... | 327/158 |
| 5,751,665 A | * | 5/1998 | Tanoi | ......................... | 368/120 |
| 5,852,640 A | * | 12/1998 | Kliza et al. | ................. | 375/356 |
| 5,883,534 A | * | 3/1999 | Kondoh et al. | ............ | 327/156 |
| 6,130,566 A | * | 10/2000 | Yokomizo | .................... | 327/175 |
| 6,225,843 B1 | * | 5/2001 | Taniguchi et al. | | |
| 6,320,436 B1 | * | 11/2001 | Fawcett et al. | ............. | 327/158 |
| 6,323,714 B1 | * | 11/2001 | Naffziger et al. | ........... | 327/295 |

* cited by examiner

Primary Examiner—Timothy P. Callahan
Assistant Examiner—Hai L. Nguyen

(57) ABSTRACT

A system and method is provided for controlling clock skew to meet timing constraints for a semiconductor integrated circuit. On-chip self-tuning circuits can be connected to each latch in the integrated circuit for controlling clock skew. Each self-tuning circuit delays a clock signal that is input to a latch when the clock skew does not satisfy the timing constraint for that latch. The self-tuning circuit repeatedly delays the clock signal until the clock skew is satisfied or until the delay becomes greater than or equal to a predetermined threshold. The delayed clock signal is then pushed to other latches in the integrated circuit until all the timing constraints for the integrated circuit are satisfied.

21 Claims, 3 Drawing Sheets

PARALLEL PUSH ALGORITHM DETECTING CONSTRAINTS TO MINIMIZE CLOCK SKEW

FIELD OF THE INVENTION

The present invention is generally related to timing in an integrated circuit. In particular, the present invention is related to controlling clock skew in an integrated circuit.

BACKGROUND OF THE INVENTION

In modern, high-performance digital circuits, precise timing is of paramount importance. Slight clock uncertainties can cause momentary, spurious signals which can become magnified as they propagate through a complex digital circuit, often with unpredictable and disastrous results. If such uncertainties are not carefully controlled, they can quickly lead to catastrophic failure or inoperativeness of the digital circuit.

Tiny differences in clock outputs coupled with propagation delays across the complex web of conducting pathways (or traces) on a printed circuit board are one source of timing uncertainty. The source of timing uncertainty effects are well-known to those of ordinary skill in the art, and is typically referred to as clock skew.

Broadly speaking, clock skew is the difference in time delay from a clock input to each of its loads. Clock skew includes the delay arising from the propagation of signals in a printed circuit board across various traces to respective components, which use clock signals as inputs.

For example, FIG. 3 shows that MY_CLK takes 4 ns to travel to a clock input for FF1, but MY_CLK takes 12 ns to travel to a clock input for FF2. In this case, there is a 8 ns clock skew for FF2. The clock skew for FF2 must satisfy the timing constraint for FF2 in order for FF2 to timely latch the data from FF1. If the delay between FF1 and FF2 is greater than the clock skew for FF2, then the clock skew for FF2 satisfies the timing constraint for FF2, and FF2 will latch the data from FF1 on a MY_CLK pulse. If the delay between FF1 and FF2 is less than the clock skew for FF2, then FF2 will latch the DATA input on a MY_CLK pulse, as if FF1 were not in the circuit.

Clock skew places limitations on the speed and performance of high-speed digital devices and must be taken into account in the design of such devices. As clock frequencies are increased aggressively in high performance designs, clock skew constraints become increasingly stringent. In GHz-clocked microprocessors, clock skews are often required to be smaller than 50 ps.

It may be possible to design a clock network having close to zero skew using CAD tools during the design of an integrated circuit. However, uncontrollable manufacturing processing, voltage and temperature (PVT) variations, which generally cannot be accounted for during the design of an integrated circuit, can cause clock skew to reach unacceptable levels. The PVT variations can be as large as 25%, causing significant clock skew. Therefore, on-chip circuitry is needed for controlling clock skew.

SUMMARY OF THE INVENTION

The present invention provides a method and on-chip circuitry for controlling clock skew to satisfy timing constraints for a semiconductor integrated circuit.

In one respect, the present invention includes a self tuning circuit comprising the following: a flip flop connected to a delay path and having a flip flop clock input; a first up-counter connected to the flip flop and having a first up-counter output; a second up-counter connected to the flip flop and the output of the first up-counter, wherein the second up-counter includes a second up-counter output; and an on-purpose delay element connected to the second up-counter output. The on-purpose delay element possesses a clock input and a clock output. The clock output is connected to a latch and the flip flop clock input, and the on-purpose delay element is operable to receive a clock signal on the clock input and transmit either a delayed clock signal or a non-delayed clock signal to the latch and flip flop clock input.

The on-purpose delay element is operable to delayed the clock signal when clock skew for the latch fails to satisfy a delay path timing constraint for that latch. Also, the on-purpose delay element is operable to transmit a non-delayed clock signal when the clock skew satisfies the timing constraint for the latch.

In another respect, the present invention provides a method of controlling clock skew for a plurality of latches in a semiconductor integrated circuit. The method includes the following steps: determining whether clock skew for a first latch satisfies a timing constraint; when the timing constraint is not satisfied, delaying a clock signal latching the latch by one time unit; and pushing the delay to a second latch connected to the first latch. The step of delaying a clock signal can further include repeatedly delaying a clock signal by one time unit and counting each time unit. The clock signal is repeatedly delayed until the timing constraint is satisfied or the total number of counted time units is equal to $2^n$ where n is the number of bits in an n-bit up counter counting each time unit.

The present invention provides a self-tuning circuit and method for controlling clock skew to satisfy timing constraints for a semiconductor integrated circuit. Due to circuit imperfections caused during manufacturing, design techniques for meeting timing constraints may be insufficient for satisfying stringent timing constraints. The present invention accounts for manufacturing imperfections by providing an on-chip solution for controlling clock skew to satisfy circuit timing constraints.

BRIEF DESCRIPTION OF THE DRAWINGS

The present invention is illustrated by way of example and not limitation in the accompanying figures in which like numeral references refer to like elements, and wherein.

DETAILED DESCRIPTION OF THE INVENTION

In the following detailed description, numerous specific details are set forth in order to provide a thorough understanding of the present invention. However, it will be apparent to one of ordinary skill in the art that the disclosed specific details need not be used to practice the present invention. In other instances, well known structures, interfaces, and processes have not been shown in detail in order not to unnecessarily obscure the present invention.

Figure 1:
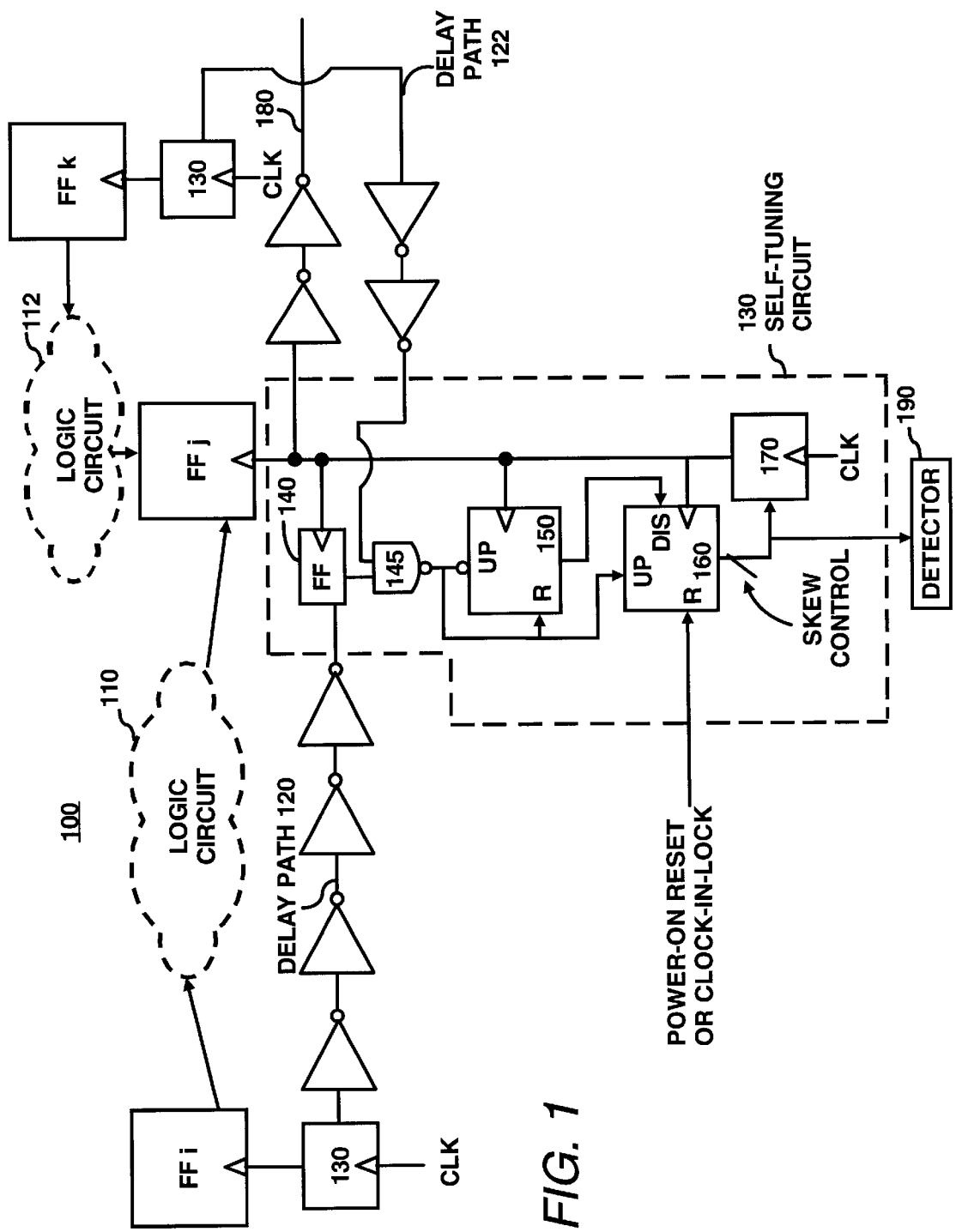
FIG. 1 illustrates a semiconductor integrated circuit employing the principles of the present invention.

FIG. 1 illustrates a schematic block diagram of an advanced clocking scheme employing the principles of the present invention. Semiconductor integrated circuit 100 includes at least flip-flops FFi, FFj and FFk. Logic circuits 110 and 112 are connected between FFi and FFj and between FFk and FFj, respectively. Logic circuits 110 and 112 can include a plurality of gates and other known circuit components.

Delay paths 120 and 122 are intended to mimic the delay between FFi and FFj and between FFk and FFj, respectively. Delay paths 120 and 122, however, may not account for clock skew caused, for example, by PVT variations and other factors that affect signal propagation. Delay paths 120 and 122 may be implemented by using inverters or other logic circuits.

Connected to FFi, FFj and FFk are self-tuning circuits 130. Self tuning circuits 130 delay clock signal CLK to meet timing constraints for each of FFi, FFj and FFk. It will be apparent to one of ordinary skill in the art that circuit 100 may contain multiple flip flops latched by CLK, and each flip flop can be connected to a self-tuning circuit for satisfying the timing constraints for that flip flop.

The components for self-tuning circuit 130 connected to FFj are shown in FIG. 1, and these components can be used for any of the self-tuning circuits connected to latches in circuit 100. Self-tuning circuit 130 includes FF 140, NAND gate 145, up-counter 150, up-counter 160 and on-purpose delay element 170.

Regarding the operation of self-tuning circuit 130, if FF 140 is enabled high, a "1" will be latched at FF 140 when the clock skew for FFj satisfies the timing constraint for FFj. For example, if the clock skew is less than or equal to the delay between FFi and FFj and the clock skew is less than or equal to the delay between FFk and FFj, NAND gate 145 will receive a "1" on both of its inputs. Then, FFj will latch the data from FFi and FFk, because the clock skew satisfies the timing constraint for FFj. Also, up-counter 150 will be incremented by one. NAND gate 145 may include more than two inputs when more than two latches that affect timing constraints for FFj are connected to FFj. Also, NAND gate 145 may be replaced by an inverter when a single latch is connected to FFj.

When the timing constraint for FFj is satisfied, the output of NAND gate 145 becomes "0" and up-counter 150 is incremented. Up-counter 150 will continue to be incremented to a predetermined number that is approximately equal to $2^n$, where n is equal to the number of bits in up-counter 150. It will be apparent to one of ordinary skill in the art that the number of bits in up-counter 150 may be chosen depending on the length of the clock cycle of the integrated circuit. If up-counter 150 reaches $2^n$, a most significant bit (MSB) output of up-counter 150 that is connected to the disable (DIS) input of up-counter 160 outputs a "1" to the DIS input. Then up-counter 160 is disabled and self-tuning circuit 130 continues to function, such that the timing constraint for FFj is met.

Alternatively, up-counter 150 may be reset, when, for example, timing changes for FFi or FFk affect the timing constraint for FFj. Under these circumstances, up-counter 160 may be incremented until the timing constraint for FFj is satisfied or until a determination is made that the circuit design is not feasible, as discussed below.

If the clock skew does not satisfy the timing constraint for FFj, up-counter 150 will be reset to zero and up-counter 160 will be incremented by one. In that case, on-purpose delay element 170 receives a skew control signal from up-counter 160, causing the on-purpose delay element to delay CLK by one time unit. It will be apparent that the length of the time unit may be readily determined by one of ordinary skill in the art based upon known factors that are associated with the timing constraints for the integrated circuit.

On-purpose delay element 170 will continue to increase the delay of CLK until the clock skew satisfies the timing constraint for FFj. When more than one latch affects the timing constraint (e.g., latch FFi and FFk affecting the timing constraint for FFj), CLK may be delayed based upon the maximum delay. For example, the delay for data to be transmitted from FFi to FFj is equal to 0.1 ns and the delay for data to be transmitted from FFk to FFj is 0.2 ns. CLK will be delayed based upon the 0.2 ns delay, because a clock signal satisfying the 0.2 ns delay will also satisfy the 0.1 ns delay.

Selecting the maximum delay is implemented using NAND gate 145. On purpose delay element 170 delays CLK until FF 140 outputs a "1" to NAND gate 145 when self-tuning circuit 130 for FFk outputs a "1" to NAND gate 145. At this time, CLK is delayed based on the 0.2 ns delay for data transmitted from FFk to FFj, and the timing constraint for FFj is satisfied. The delay for CLK is then pushed to other self-tuning circuits 130 that are connected to flip flops that may receive data from FFj.

For example, when CLK is delayed by circuit 130 for FFj, the delayed clock signal CLK is transmitted on delay path 180 to another self-tuning circuit (not shown) that controls clock skew for another flip flop (not shown) connected to FFj. The self-tuning circuit for that flip flop may then select a maximum delay, for example, using a NAND gate similar to NAND 145 for latching data from FFj. Then, the clock signal may be delayed again and transmitted to another self-tuning circuit via another delay path. Therefore, the delayed clock signal CLK for FFj is pushed throughout circuit 100 until the timing constraints for all the flip flops in circuit 100 are satisfied.

The output of up-counter 160 may be connected to detector 190 for detecting when up-counter 160 has been incremented to a predetermined number (i.e., bMax) that is approximately equal to $2^n$, where n is equal to the number of bits in up-counter 160. It will be apparent to one of ordinary skill in the art that the number of bits in up-counter 160 may be chosen depending on the length of the clock cycle of the integrated circuit. Therefore, if CLK is delayed by a period of time approximately greater than a clock cycle for the integrated circuit, then the timing constraints for the circuit likely cannot be satisfied. If up-counter 160 reaches bMax, then CLK is likely delayed by a period of time greater than a clock cycle for the integrated circuit. Accordingly, the timing constraints for circuit 100 are likely not feasible. Detector 190 detects when bMax is reached. For example, if up-counter 160 is an 8-bit counter, detector circuit 190 can detect when "11111111" is output by up-counter 160. The detector can be connected to an indicator for indicating when bMax has been reached.

Figure 2:
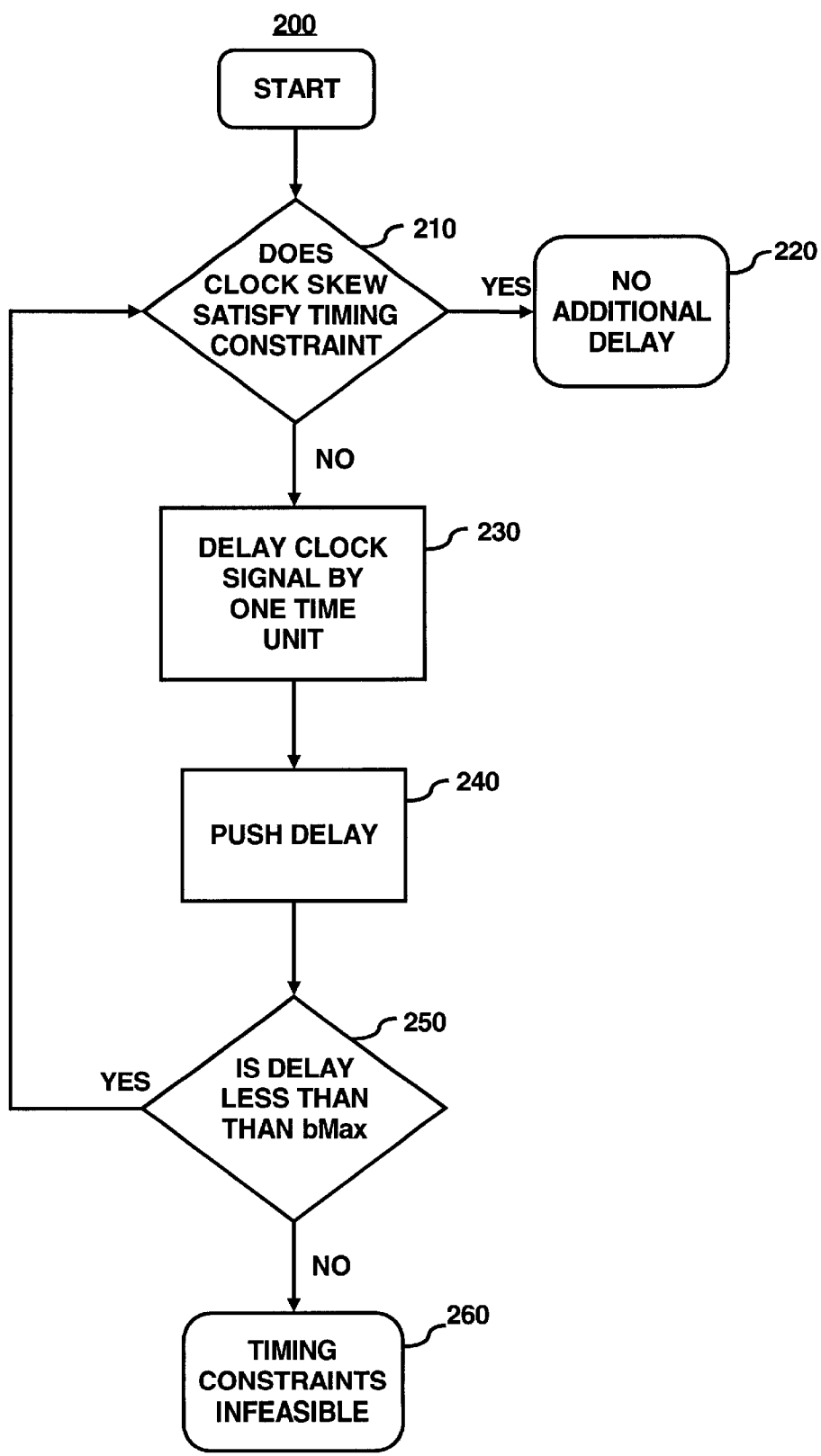
FIG. 2 illustrates a method for controlling clock skew.
Figure 3:
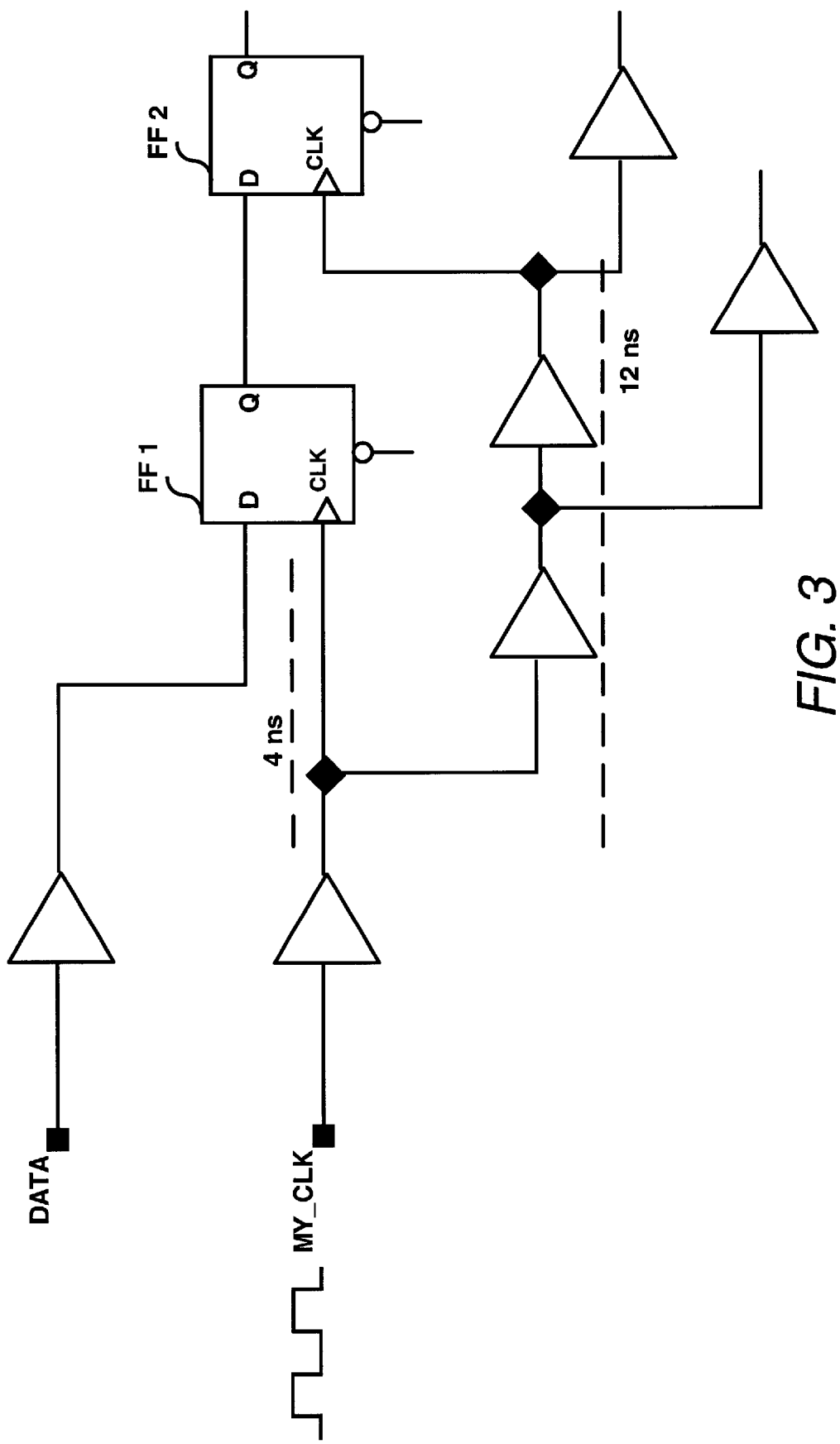
FIG. 3 illustrates clock timing parameters for latches in a semiconductor integrated circuit.

FIG. 2 illustrates a method 200 for controlling clock skew in a semiconductor integrated circuit. In step 210, a self-tuning circuit determines whether clock skew for a latch in the integrated circuit satisfies a timing constraint for that latch. Step 210 may include determining whether data from multiple latches can be latched on a clock signal, such as implemented using NAND gate 145, as described above and shown in FIG. 1.

When the clock skew fails to satisfy the timing constraint for the latch, a clock signal that is input to the latch is delayed by one time unit (step 230).

Alternatively, when the clock skew satisfies the timing constraint, the latch operates to latch data transmitted by another latch, as designed. Accordingly, the clock signal is not additionally delayed by the self-tuning circuit in step 220.

In step 240, the delayed clock signal is pushed to other latches in the circuit. For example, if the latch is transmitting data to another latch in the circuit, the clock signal delayed in step 230 is propagated to a self tuning circuit connected to the latch receiving the data.

In step 250, the number of time units that the clock signal has been delayed by is compared to bMax. If the number of time units is not less than bMax, the timing constraints for the integrated circuit likely cannot be satisfied (step 260). A detector can provide notification that the timing constraints are not feasible.

If the number of time units is less than bMax, step 210 is performed. In step 210, the self-tuning circuit determines whether clock skew for the latch satisfies the timing constraint for the latch based upon the delayed clock signal. Therefore, the clock signal is delayed until the clock skew satisfies the timing constraint or until the total number of time units that the clocked signal has been delayed by is not less than bMax.

The steps described above and shown in FIG. 2 may be performed by the self-tuning circuit of the present invention. Also, while this invention has been described in conjunction with the specific embodiments thereof, it is evident that many alternatives, modifications and variations will be apparent to those skilled in the art. There are changes that may be made without departing from the spirit and scope of the invention.

What is claimed is:

1. A semiconductor integrated circuit comprising:
   a flip flop connected to a delay path, said flip flop having a flip flop clock input;
   a first up-counter connected to said flip flop, said first up-counter having a first up-counter output;
   a second up-counter connected to said flip flop and said first up-counter output; said second up-counter having a second up-counter output; and
   an on-purpose delay element connected to said second up-counter output, said on-purpose delay element having a clock input and a clock output, said clock output being connected to a latch and said flip flop clock input, and said on-purpose delay element being operable to receive a clock signal on said clock input and transmit a delayed clock signal to said latch and said flip flop clock input from said clock output, when clock skew for said latch fails to satisfy a timing constraint for said latch.

2. The semiconductor integrated circuit of claim 1, wherein said latch includes a flip flop.

3. The semiconductor integrated circuit of claim 1, wherein said flip flop is not enabled to latch data, said first up-counter is reset and said second up-counter is incremented by one when said clock skew fails to satisfy said timing constraint.

4. The semiconductor integrated circuit of claim 3, wherein said flip flop is not enabled to latch data, said first up-counter is reset and said second up-counter is incremented by one when said clock skew fails to satisfy said timing constraint.

5. The semiconductor integrated circuit of claim 4, further comprising a NAND gate having a first input connected to said flip flop, at least one input connected to a second delay path and an output connected to said first up-counter, wherein said first up-counter is incremented by one when said NAND gate receives a clock signal on said second delay path.

6. The semiconductor integrated circuit of claim 5, wherein said second up-counter includes an input connected to said NAND gate output, and said second up-counter is incremented by one in response to one or more of said flip flop being not enabled to latch a signal received from said delay path and said NAND not receiving a clock signal on said second delay path.

7. The semiconductor integrated circuit of claim 1, wherein said on-purpose delay element is operable to receive a clock skew control signal from said second up-counter, said clock skew control signal causing said on-purpose delay element to delay said clock signal when said clock skew fails to satisfy said timing constraint.

8. The semiconductor integrated circuit of claim 1, wherein said delayed clock signal is repeatedly delayed by one time unit until said clock skew satisfies said timing constraint.

9. The semiconductor integrated circuit of claim 8, wherein said second counter is an N-bit counter, and wherein said circuit is operable to detect when said second up-counter is incremented to a value equal to $2^N$.

10. The semiconductor integrated circuit of claim 1, wherein said first-up counter and said second up counter receive the clock signal from said clock output of said on-purpose delay element.

11. The semiconductor integrated circuit of claim 1, wherein the clock signal from said clock output of said on-purpose delay element is transmitted to a second latch connected to said latch.

12. A method of controlling clock skew for a plurality of latches in a semiconductor integrated circuit, said method comprising steps of:
   determining whether clock skew for a first latch of said plurality of latches satisfies a timing constraint;
   when said timing constraint is not satisfied, delaying a clock signal latching said latch by one time unit; and
   pushing the delayed clock signal to a second latch of said plurality of latches that is connected to said first latch.

13. The method of claim 12, wherein said step of delaying a clock signal further comprises steps of:
   repeatedly delaying a clock signal by one unit; and
   counting each time unit.

14. The method of claim 13, wherein said step of repeatedly delaying further comprises a step of repeatedly delaying said clock signal until one of (1) said timing constraint is satisfied and (2) a count of each time unit is approximately greater than a clock cycle for said circuit.

15. The method of claim 12, further comprising a step of when said timing constraint is satisfied, latching said latch with a clock signal.

16. The method of claim 12, wherein said latch is a flip flop.

17. An apparatus for controlling clock skew comprising:
   means for determining whether clock skew for a first latch of a plurality of latches satisfies a timing constraint;
   means for delaying a clock signal, causing latching in said first latch, by one time unit when said timing constraint is not satisfied; and
   means for pushing the delayed clock signal to a second latch of said plurality of latches that is connected to said first latch.

18. The apparatus of claim 17, wherein the means for delaying a clock signal further comprises:

means for repeatedly delaying the clock signal by one unit; and means for counting each time unit.

19. The apparatus of claim 18, wherein the means for repeatedly delaying a clock signal repeatedly delays said clock signal until one of (1) said timing constraint is satisfied and (2) a count of each time unit is approximately greater than a clock cycle.

20. The apparatus of claim 17, wherein the first latch latches data in response to the timing constraint being satisfied.

21. The apparatus of claim 17, wherein the first latch is a flip flop.

* * * * *